US012796499B2

(12) United States Patent
Fan et al.

(10) Patent No.: US 12,796,499 B2
(45) Date of Patent: Nov. 10, 2026

(54) SEMICONDUCTOR PACKAGE REDISTRIBUTION LAYER STRUCTURE

(71) Applicant: MEDIATEK INC., Hsinchu City (TW)

(72) Inventors: Chih-Feng Fan, Hsinchu City (TW); De-Wei Liu, Hsinchu City (TW); Yu-Chao Lin, Hsinchu City (TW)

(73) Assignee: MEDIATEK INC., Hsinchu City (TW)

(*) Notice: Subject to any disclaimer, the term of this patent is extended or adjusted under 35 U.S.C. 154(b) by 934 days.

(21) Appl. No.: 17/696,042

(22) Filed: Mar. 16, 2022

(65) Prior Publication Data

US 2022/0319970 A1 Oct. 6, 2022

Related U.S. Application Data

(60) Provisional application No. 63/169,266, filed on Apr. 1, 2021.

(51) Int. Cl.

| | |
|---|---|
| ***H10W 70/65*** | (2026.01) |
| ***H10W 72/59*** | (2026.01) |
| ***H10W 72/90*** | (2026.01) |
| ***H10W 90/00*** | (2026.01) |

(52) U.S. Cl.

CPC ............ *H10W 70/65* (2026.01); *H10W 72/59* (2026.01); *H10W 72/90* (2026.01); *H10W 90/754* (2026.01)

(58) Field of Classification Search

CPC ......... H01L 23/49838; H01L 23/49833; H01L 2924/181; H01L 23/522; H01L 23/49822; H01L 23/5383; H01L 23/498–49894; H01L 23/538–5389; H01L 24/18–25; H01L 2224/18–255; H01L 2224/023–024; H10W 70/65

See application file for complete search history.

(56) References Cited

U.S. PATENT DOCUMENTS

| | | | | |
|---|---|---|---|---|
| 11,652,273 | B2 | 5/2023 | Liu et al. | |
| 2006/0220215 | A1 | 10/2006 | Lee | |
| 2009/0152740 | A1 | 6/2009 | Park | |
| 2011/0074018 | A1 | 3/2011 | Fukuda | |
| 2020/0091097 | A1* | 3/2020 | Hung | H01L 24/19 |
| 2021/0057352 | A1* | 2/2021 | Agarwal | H10P 72/74 |
| 2021/0125908 | A1* | 4/2021 | Jang | H10P 72/74 |
| 2021/0167017 | A1* | 6/2021 | Eom | H01L 24/45 |

FOREIGN PATENT DOCUMENTS

| | | | |
|---|---|---|---|
| EP | 3 091 571 | A2 | 11/2016 |
| EP | 3 399 548 | A1 | 11/2018 |
| TW | 201947735 | A | 12/2019 |

* cited by examiner

*Primary Examiner* — Kevin Parendo

(74) *Attorney, Agent, or Firm* — McClure, Qualey & Rodack, LLP

(57) ABSTRACT

A semiconductor package disposed on a base is provided. The semiconductor package includes a semiconductor chip and a redistribution layer (RDL) structure. The semiconductor chip includes a first chip pad and a second chip pad. The redistribution layer (RDL) structure partially covers the semiconductor chip and is separated from the base by the semiconductor chip. The RDL structure includes a redistribution layer (RDL) trace having a first end and a second end. The first end of the RDL trace is electrically coupled to the first chip pad. The second end of the RDL trace is electrically coupled to the second chip pad.

20 Claims, 5 Drawing Sheets

SEMICONDUCTOR PACKAGE REDISTRIBUTION LAYER STRUCTURE

CROSS REFERENCE TO RELATED APPLICATIONS

This application claims the benefit of U.S. Provisional Application No. 63/169,266, filed Apr. 1, 2021, the entirety of which is incorporated by reference herein.

BACKGROUND OF THE INVENTION

Field of the Invention

The present invention relates to a semiconductor package, and, in particular, to a semiconductor package having the improved IR drop performance.

Description of the Related Art

In order to ensure miniaturization and multi-functionality of electronic products and communication devices, semiconductor packages with integrated circuit dies are designed to be small in size to support high operating speeds and high functionality. The multi-functional system-on-a-chip (SoC) package includes a single chip (a SoC chip) that integrates multiple functional circuits that are typically needed for a system into the single chip itself.

When the chip size of the SoC chips is increased in order to accommodate more integrated circuits and to meet various product requirements, the requirements for power consumption of the chips is continuously increased. In addition, the impact of IR drop, which is induced by the currents that flow through the resistive parasitic elements, on the chip performance is also required to be strictly controlled. Therefore, methods for effectively addressing IR drop in order to improve the chip performance become an important issue for development of semiconductor integrated circuit (IC) packaging technology.

Thus, a novel SoC package is desirable to improve IR drop performance.

BRIEF SUMMARY OF THE INVENTION

An embodiment of the present invention provides a semiconductor package disposed on a base. The semiconductor package comprises a semiconductor chip and a redistribution layer (RDL) structure. The semiconductor chip comprises a first chip pad and a second chip pad. The redistribution layer (RDL) structure partially covers the semiconductor chip. The redistribution layer (RDL) structure is separated from the base by the semiconductor chip. The RDL structure comprises a redistribution layer (RDL) trace having a first end and a second end. The first end of the RDL trace is electrically coupled to the first chip pad. The second end of the RDL trace is electrically coupled to the second chip pad.

An embodiment of the present invention provides a semiconductor package disposed on a base. The semiconductor package comprises a semiconductor chip, and a redistribution layer (RDL) structure. The semiconductor chip has a front surface and a back surface. The back surface is opposite the front surface, and the back surface of the semiconductor chip is close to the base. The redistribution layer (RDL) structure is disposed on the front surface of the semiconductor chip. The redistribution layer (RDL) structure overlaps a first chip pad and a second chip pad of the semiconductor chip. The redistribution layer (RDL) structure is electrically coupled to the first chip pad and the second chip pad of the semiconductor chip. The RDL structure is disposed in such a way that it does not overlap the third chip pad of the semiconductor chip.

In addition, an embodiment of the present invention provides a semiconductor package disposed on a base. The semiconductor package comprises a semiconductor chip and a redistribution layer (RDL) structure. The semiconductor chip comprises a first chip pad, a second chip pad, and a third chip pad. The redistribution layer (RDL) structure overlaps a portion of the semiconductor chip. The redistribution layer (RDL) structure is separated from the base by the semiconductor chip. The RDL structure is electrically coupled to the first chip pad and the second chip pad of the semiconductor chip. The sidewall of the RDL structure is laterally disposed between the first chip pad of the semiconductor chip and the third chip pad of the semiconductor chip.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
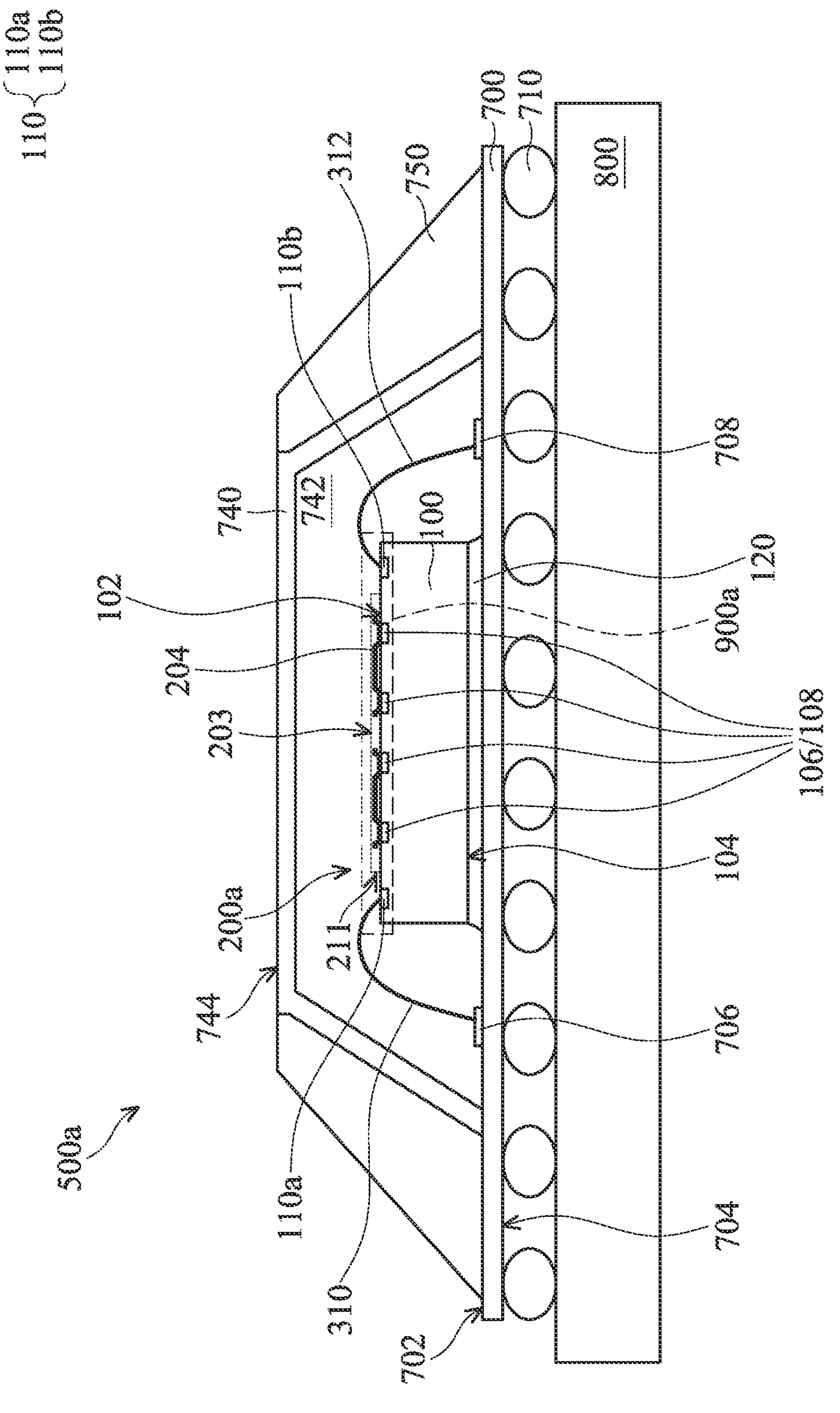
FIG. 1 is a cross-sectional of a semiconductor package in accordance with some embodiments of the disclosure.

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention Embodiments provide a semiconductor package such as a system-on-chip (SOC) package. The semiconductor package includes a redistribution layer (RDL) structure partially covering a semiconductor chip and having redistribution layer (RDL) traces electrically connected between chip pads (e.g., power pads) of the semiconductor chip. Since the RDL traces of the RDL structure has grater width than interconnections (or circuits) within the semiconductor chip, the RDL traces may provide external conductive paths with a lower resistance for the power circuits (or other functional circuits) of the semiconductor chip to improve the IR drop (the voltage drop when current flows through a resistor) performance. Also, the RDL structure is designed to partially cover rather than fully cover the semiconductor chip, some electrically connections between redistribution layer (RDL) pads of the RDL structure and the chip pads of the semiconductor chip outside the RDL structure can be achieved by bonding wires to increase the design flexibility.

Figure 2:
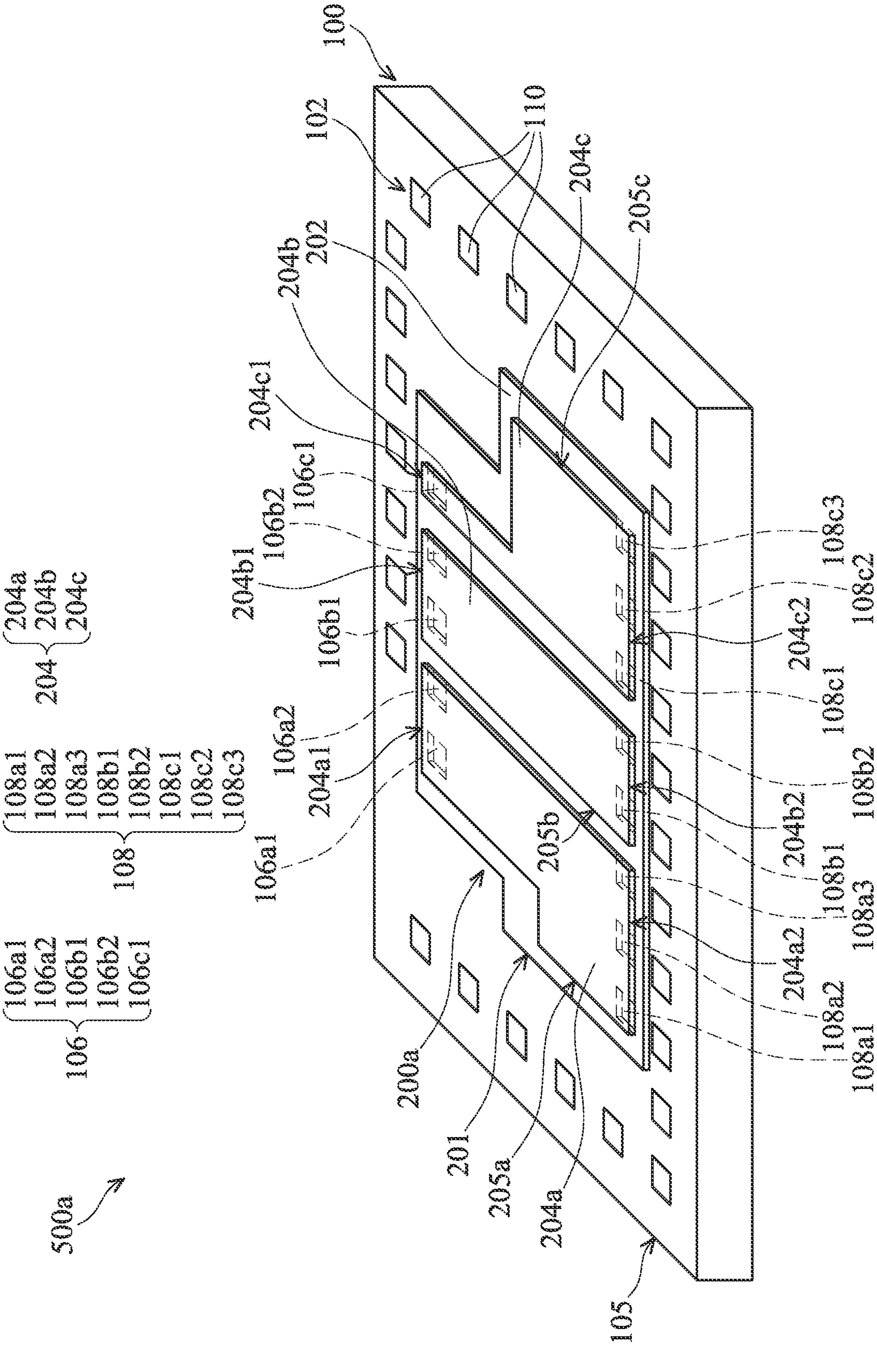
FIG. 2 is a top view of a region shown in FIG. 1, showing the arrangements of a semiconductor chip and a redistribution layer (RDL) structure of the semiconductor package shown in FIG. 1 in accordance with some embodiments of the disclosure.

FIG. 1 is a cross-sectional of a semiconductor package 500*a* in accordance with some embodiments of the disclosure. FIG. 2 is a top view of a region 900*a* shown in FIG. 1, showing the arrangements of a semiconductor chip 100 and a redistribution layer (RDL) structure 200*a* of the semiconductor package 500*a* shown in FIG. 1 in accordance with some embodiments of the disclosure. For clearly showing the electrical connections between the semiconductor chip 100 and the redistribution layer (RDL) structure 200*a*, a passivation layer covering RDL traces of the RDL structure 200*a*, a heat dissipation structure, a molding compound and bonding wires connecting between the semiconductor chip 100 and bonding pads of the substrate 700 are not shown in FIG. 2.

As shown in FIG. 1, the semiconductor package 500*a* is disposed on a base 800 through a plurality of conductive structures 710. FIG. 2 is a top view of a semiconductor chip 100 and a redistribution layer (RDL) structure 200 of the semiconductor package 500*a* shown in FIG. 1 in accordance with some embodiments of the disclosure. In some embodiments, the semiconductor package 500*a* serves as a system-on-chip (SOC) package. In some embodiments, the base 800 may include a printed circuit board (PCB). The conductive structures 710 may include conductive bump structures such as copper bumps, solder ball structures, solder bump structures, conductive pillar structures, conductive wire structures, or conductive paste structures.

As shown in FIG. 1, the semiconductor package 500*a* includes a substrate 700, a semiconductor chip 100, and a redistribution layer (RDL) structure 200*a*. It should be noted that the substrate 700, the semiconductor chip 100 and the RDL structure 200*a* are discrete, individual elements of the semiconductor package 500*a*.

As shown in FIG. 1, the substrate 700 is disposed between the base 800 and the semiconductor chip 100. The substrate 700 includes a first surface 702 and a second surface 704 opposite to the first surface 702. The first surface 702 of the substrate 700 is provided for the semiconductor chip 100 disposed thereon. The second surface 704 is provided for the conductive structures 710 electrically connected thereon. The substrate 700 includes several discrete bonding pads 706 and 708 disposed close to the first surface 702. In some embodiments, the bonding pads 706 and 708 may serve as electrical connections to transmit input/output (I/O), ground or power signals from the semiconductor chip 100. The substrate 700 may also include an interconnection (not shown) formed therein to be electrically coupled to the bonding pads 706 and 708. In some embodiments, the substrate 700 may comprise a semiconductor substrate, such as a silicon substrate. In some other embodiments, the substrate 700 may comprise a dielectric material such as an organic material. In some embodiments, the organic material includes polypropylene (PP) with glass fiber, epoxy resin, polyimide, cyanate ester, other suitable materials, or a combination thereof.

As shown in FIGS. 1 and 2, the semiconductor chip 100 is disposed on the substrate 700. The semiconductor chip 100 has a front surface (an active surface) 102 and a back surface (an inactive surface) 104 opposite to the front surface 102. The back surface 104 of the semiconductor chip 100 is close to the base 800. The semiconductor chip 100 includes chip pads 106, 108 and 110 disposed close to the front surface 102 of the semiconductor chip 100. In some embodiments, the chip pads 110 are located adjacent to a boundary 105 of the front surface 102 of the semiconductor chip 100. In some embodiments, the chip pads 106, 108 and 110 may use as input/output (I/O) connections of the semiconductor chip 100. The chip pads 106 and 108 may be the same functional pads (e.g. power pads). In addition, the chip pads 110 and the chip pads 106 (or the chip pads 108) may be the same or different functional pads. The back surface 104 of the semiconductor chip 100 is disposed on the first surface 702 of the substrate 700 through an adhesive 120 (for example, paste) between the semiconductor chip 100 and the substrate 700. In other words, the substrate 700 is disposed close to the back surface 104 of the semiconductor chip 100. In some embodiments, the semiconductor chip 100 may serve as a system-on-chip (SOC) chip 100 including a microcontroller (MCU), a microprocessor (MPU), a power management integrated circuit (PMIC), a global positioning system (GPS) apparatus, a radio frequency (RF) apparatus, a central processing unit (CPU), a graphics processing unit (GPU), a dynamic random access memory (DRAM) controller, a static random-access memory (SRAM), a high bandwidth memory (HBM), or any combination thereof. In other embodiments, the semiconductor chip 100 includes a memory chip, for example, a dynamic random access memory (DRAM) chip. In some embodiments, the semiconductor package 500*a* may not include the substrate 700, and the semiconductor chip 100 is disposed on the base 800 without the substrate 700 disposed therebetween.

As shown in FIGS. 1 and 2, the redistribution layer (RDL) structure 200*a* is disposed on and in contact with the front surface 102 of the semiconductor chip 100. Therefore, the RDL structure 200*a* is separated from the substrate 700 and the base 800 through the semiconductor chip 100. In some embodiments, the RDL structure 200*a* partially covers the front surface 102 of the semiconductor chip 100, such that a boundary 201 of the RDL structure 200*a* is located within the boundary 105 of the semiconductor chip in a top view as shown in FIG. 2. Since the RDL structure 200*a* overlaps with a portion of the semiconductor chip 100, the overlapping area between the RDL structure 200*a* and the semiconductor chip 100 is the same size as the area of the RDL structure 200*a* in a top view as shown in FIG. 2. Also, the area of the RDL structure 200*a* is less than the area of the front surface 102 of the semiconductor chip 100 in a top view as shown in FIG. 2. In some embodiments, the area of the RDL structure 200*a* is greater than 50% but less than 100% of the area of the front surface 102 of the semiconductor chip 100 in the top view as shown in FIG. 2. In some embodiments, the RDL structure 200*a* is disposed overlapping and electrically coupled to chip pads 106 and 108 (e.g.

power pads) of the semiconductor chip 100. In some embodiments, a portion of the interconnections (e.g. conductive lines and vias) of the same functional circuits (not shown) of the semiconductor chip 100 are rerouted to the adjacent chip pads 106 and 108 of the semiconductor chip 100. Also, the RDL structure 200*a* is disposed in such a way that it does not overlap the chip pads 110 (e.g. power pads, signal pads or ground pads) of the semiconductor chip 100. Therefore, the chip pads 110 close to the boundary 105 of the semiconductor chip 100 can be exposed from the RDL structure 200*a*. In some embodiments, a sidewall 211 of the RDL structure 200 is disposed laterally between the chip pads 106 (or the chip pads 108) and the chip pads 110 of the semiconductor chip 100, as shown in FIG. 1.

As shown in FIGS. 1 and 2, the RDL structure 200*a* may comprise a dielectric material layer 202 (e.g., a polyimide layer) and redistribution layer (RDL) traces 204 on the dielectric material layer 202. In addition, the RDL structure 200*a* may further comprise a passivation layer (not shown) covering the RDL traces 204. In some embodiments, two ends of each of the RDL traces 204 (including RDL traces 204*a*, 204*b* and 204*c*) are respectively in contact with and electrically coupled to the corresponding chip pads 106 (including chip pad 106*a*1, 106*a*2, 106*b*1, 106*b*2 and 106*c*1) and the chip pads 108 (including chip pad 108*a*1, 108*a*2, 108*a*3, 108*b*1, 108*b*2, 108*c*1, 108*c*2 and 108*c*3) of the semiconductor chip 100, as shown in FIG. 2. For example, the RDL trace 204*a* has two ends 204*a*1 and 204*a*2 opposite to each other, the end 204*a*1 is in contact with and electrically coupled to the chip pads 106*a*1 and 106*a*2, and the end 204*a*2 is in contact with and electrically coupled to the chip pads 108*a*1, 108*a*2 and 108*a*3. Similarly, the RDL trace 204*b* has two ends 204*b*1 and 204*b*2 opposite to each other, the end 204*b*1 is in contact with and electrically coupled to the chip pads 106*b*1 and 106*b*2, and the end 204*a*2 is in contact with and electrically coupled to the chip pads 108*b*1 and 108*b*2. Similarly, the RDL trace 204*c* has two ends 204*c*1 and 204*c*2 opposite to each other, the end 204*c*1 is in contact with and electrically coupled to the chip pad 106*c*1, and the end 204*c*2 is in contact with and electrically coupled to the chip pads 108*c*1, 108*c*2 and 108*c*3. In some embodiments, the ends of each of the RDL traces 204*a*, 204*b* and 204*c* are not designed to be in contact with some other chip pads (e.g. the chip pads 110) of the semiconductor chip 100.

In some embodiments, the chip pads 106 and 108 covered by the RDL traces 204 are positioned within boundaries of the corresponding RDL traces 204 in a top view as shown in FIG. 2. For example, the chip pads 106*a*1, 106*a*2, 108*a*1, 108*a*2 and 108*a*3 are positioned within a boundary 205*a* of the corresponding RDL traces 204*a* in the top view as shown in FIG. 2. The chip pads 106*b*1, 106*b*2, 108*b*1 and 108*b*2 are positioned within a boundary 205*b* of the corresponding RDL traces 204*b* in the top view as shown in FIG. 2. The chip pads 1106*c*1, 1108*c*1, 108*c*2 and 108*c*3 are positioned within a boundary 205*c* of the corresponding RDL traces 204*c* in the top view as shown in FIG. 2.

As shown in FIG. 1, the semiconductor package 500*a* further includes bonding wires 310 and 312 use as conductive routings between chip pads 110*a* and 110*b* of the semiconductor chip 100 and the bonding pads 706 and 708 of the substrate 700. In addition, the chip pads 110*a* and 110*b* are disposed outside the boundary 201 (shown in FIG. 2) (or the sidewall 211) the RDL structure 200*a*. More specifically, the bonding wire 310 has two terminals being in contact with and electrically coupled to the chip pad 110*a* of the semiconductor chip 100 and the bonding pad 706 of the substrate 700, respectively. Also, the bonding wire 312 has two terminals being in contact with and electrically coupled to the chip pad 110*b* of the semiconductor chip 100 and the bonding pad 708 of the substrate 700, respectively.

As shown in FIG. 1, the semiconductor package 500*a* further includes a heat dissipation structure 740 disposed on the first surface 702 of the substrate 700. The heat dissipation structure 740 covers and spaces apart from the semiconductor chip 100, the RDL structure 200*a* and the bonding wires 310 and 312. The heat dissipation structure 740 and the substrate 700 connected thereto are collectively form a space 742 accommodating the semiconductor chip 100, the RDL structure 200*a* and the bonding wires 310 and 312. In some embodiments, the heat dissipation structure 740 can be formed with, for example, the Q-like shape in a cross-sectional view as shown in FIG. 1. In some embodiments, the heat dissipation structure 740 is formed of copper, aluminum, or another metal alloy.

As shown in FIG. 1, the semiconductor package 500*a* further includes a molding compound 750 covering the front surface 102 of the semiconductor chip 100, a portion of the substrate 700, and sidewalls of the heat dissipation structure 740, so that a top surface 744 of the heat dissipation structure 740 over the semiconductor chip 100 is exposed. Also, the molding compound 750 fills the space 742 between the heat dissipation structure 740 and the substrate 700. In some embodiments, the molding compound 750 surrounds the semiconductor chip 100, the RDL structure 200*a*, the bonding wires 310 and 312 and the heat dissipation structure 740. The molding compound 750 is in contact with the semiconductor chip 100, the RDL structure 200*a*, the bonding wires 310 and 312, and the heat dissipation structure 740. The molded compound 750 also covers the first surface 702 of the substrate 700. In some embodiments, the molded compound 750 may be formed of a nonconductive material, such as an epoxy, a resin, a moldable polymer, or the like. The molding compound 750 may be applied while substantially liquid, and then may be cured through a chemical reaction, such as in an epoxy or resin. In some other embodiments, the molding compound 750 may be an ultraviolet (UV) or thermally cured polymer applied as a gel or malleable solid capable of being disposed around the semiconductor chip 100, and then may be cured through a UV or thermally curing process. The molding compound 750 may be cured with a mold.

In some embodiments, the semiconductor package 500*a* is designed to include the RDL structure 200*a* to provide external conductive paths to replace portions of internal interconnections of the same functional circuits of the semiconductor chip 100, such that the RDL structure 200*a* can be designed to partially cover rather than fully cover the semiconductor chip 100. In some embodiments, the RDL traces 204 of the RDL structure 200*a* are designed to have grater width than the interconnections (not shown) of the same functional circuits of the semiconductor chip 100. Therefore, the RDL traces 204 may provide conductive paths with a lower resistance. Some internal circuits having the same function (e.g. the power circuits) and at different positions of the semiconductor chip 100 may be respectively rerouted and electrically connected to the chip pads 106 and 108 (e.g., power pads) of the semiconductor chip 100. In addition, the chip pads 106 and 108 can be electrically coupled to each other through the external RDL traces 204 of the RDL structure 200*a* having the lower resistance. Therefore, the RDL structure 200*a* of the semiconductor package 500*a* may further increase the feasibility of routing in the semiconductor chip 100. Therefore, the whole semiconductor chip 100 may have improved IR drop performance. In addition, the RDL structure 200a of the semiconductor package 500a may facilitate rerouting the current paths in regions of high power density in the semiconductor chip 100, such that the current hot spots in the semiconductor chip 100 could be effectively reduced. Further, the RDL structure 200a of the semiconductor package 500a may prevent other different power circuits from cutting off the RDL connections of the power/ground mesh inside the semiconductor chip 100 (IC), such that the power integrity could be assured.

Figure 3:
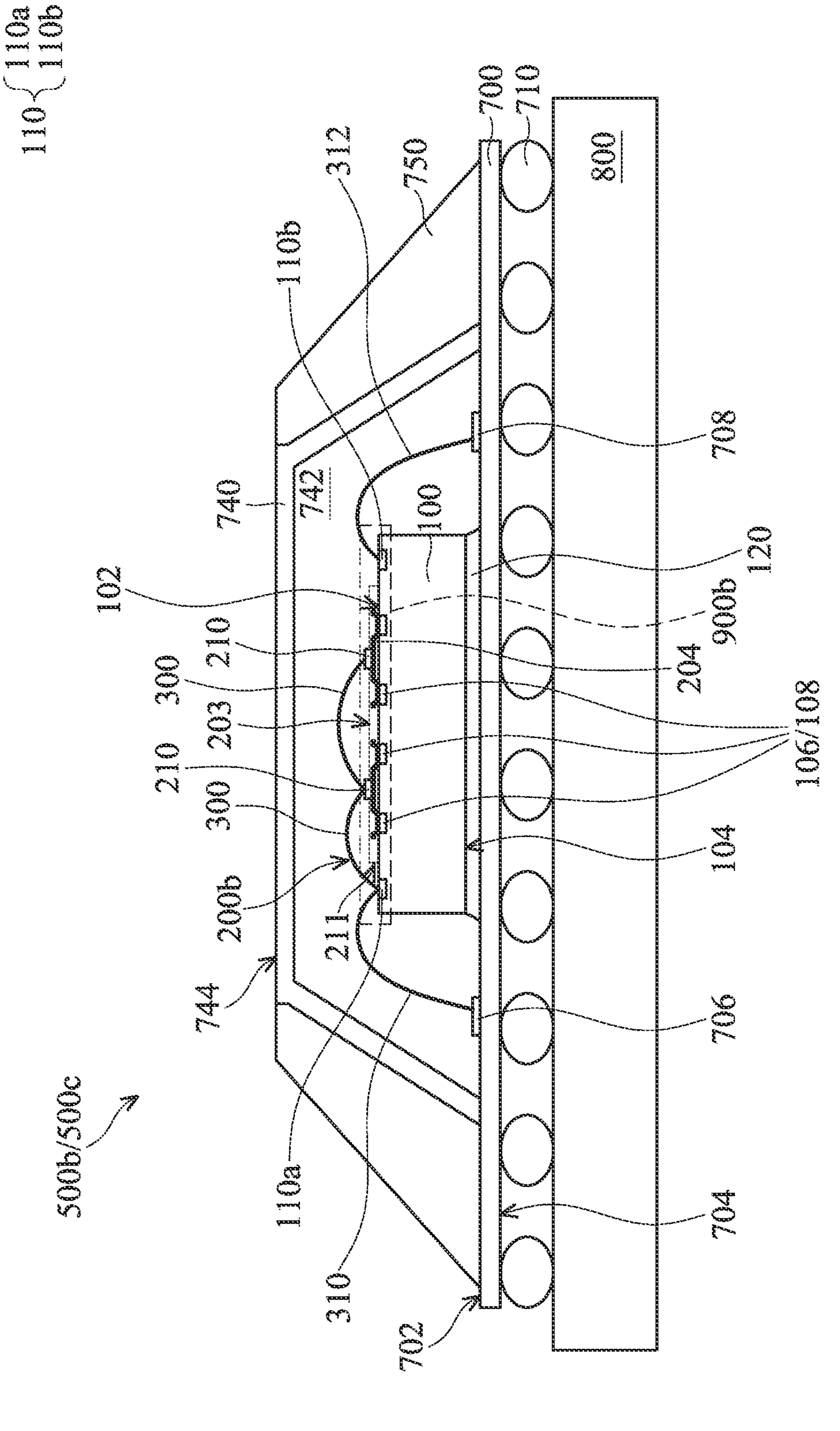
FIG. 3 is a cross-sectional of a semiconductor package in accordance with some embodiments of the disclosure.
Figure 4:
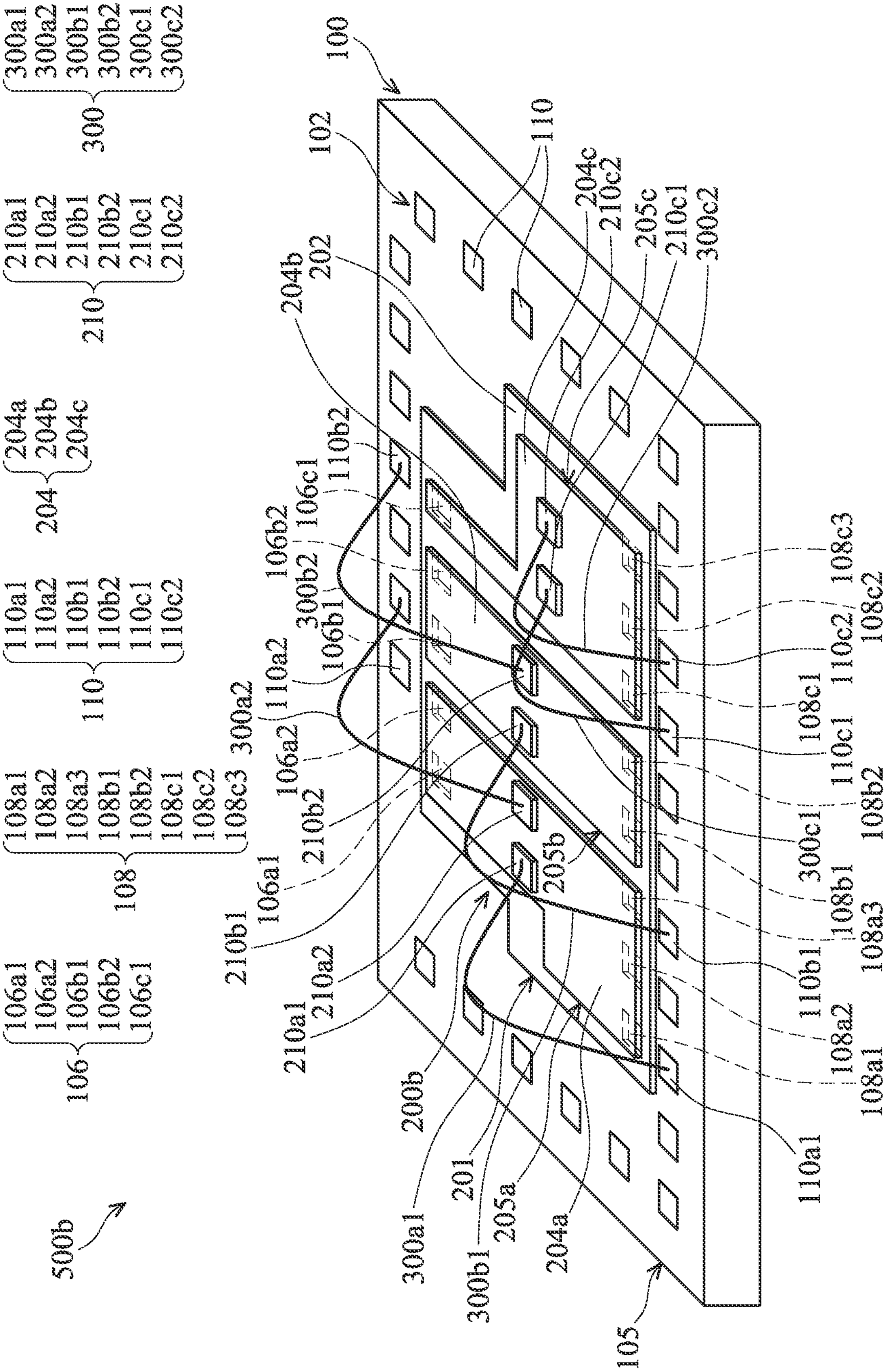
FIG. 4 is a top view of a region shown in FIG. 3, showing the arrangements of a semiconductor chip, a redistribution layer (RDL) structure and bonding wires of the semiconductor package shown in FIG. 3 in accordance with some embodiments of the disclosure.

FIG. 3 is a cross-sectional of a semiconductor package 500b (or a semiconductor package 500c) in accordance with some embodiments of the disclosure. FIG. 4 is a top view of a region 900b shown in FIG. 3, showing the arrangements of the semiconductor chip 100, a redistribution layer (RDL) structure 200b and bonding wires 300 of the semiconductor package 500b shown in FIG. 3 in accordance with some embodiments of the disclosure. For clearly showing the conductive routings between the semiconductor chip 100 and the redistribution layer (RDL) structure 200b, the passivation layer covering RDL traces of the RDL structure 200a, the heat dissipation structure, the molding compound and the bonding wires connecting between the semiconductor chip 100 and the bonding pads of the substrate 700 are not shown in FIG. 4. Elements of the embodiments hereinafter, that are the same or similar as those previously described with reference to FIGS. 1 and 2, are not repeated for brevity.

The difference between the semiconductor package 500a and the semiconductor package 500b is that the semiconductor package 500b includes redistribution layer (RDL) pads 210 on the RDL trace and bonding wires 300 connecting between the RDL pads 210 and the chip pads 110 without covered by the RDL structure 200b. The RDL pads 210 and the bonding wires 300 connected thereto of the semiconductor packages 500b may provide the design flexibility for the external electrical connections for the semiconductor chip 100.

As shown in FIGS. 3 and 4, the RDL structure 200b of the semiconductor package 500b further comprises the redistribution layer (RDL) pads 210 (including RDL pads 210a1, 210a2, 210b1, 210b2, 210c1 and 210c2) disposed on and electrically coupled to the corresponding RDL trace 204. For example, the RDL pads 210a1 and 210a2 are disposed on and electrically coupled to the corresponding RDL trace 204a. The RDL pads 210b1 and 210b2 are disposed on and electrically coupled to the corresponding RDL trace 204b. Also, the RDL pads 210c1 and 210c2 are disposed on and electrically coupled to the corresponding RDL trace 204c. In some embodiments, the RDL pads 210a1 and 210a2 are disposed between the two ends 204a1 and 204a2 of the RDL trace 204a and within the boundary 205a of the RDL trace 204a. The RDL pads 210b1 and 210b2 are disposed between the two ends 204b1 and 204b2 of the RDL trace 204b and within the boundary 205b of the RDL trace 204b. The RDL pads 210c1 and 210c2 are disposed between the two ends 204c1 and 204c2 of the RDL trace 204c and within the boundary 205c of the RDL trace 204c.

In some embodiments, the RDL pads 210 are electrically coupled to the corresponding chip pads 106 and 108 of the semiconductor chip 100 through the corresponding RDL traces 204. For example, the RDL pads 210a1 and 210a2 are electrically coupled to the corresponding chip pads 106a1, 106a2, 108a1 and 108a2 of the semiconductor chip 100 through the corresponding RDL trace 204a. The RDL pads 210b1 and 210b2 are electrically coupled to the corresponding chip pads 106b1, 106b2, 108b1 and 108b2 of the semiconductor chip 100 through the corresponding RDL trace 204b. The RDL pads 210c1 and 210c2 are electrically coupled to the corresponding chip pads 106c1, 108c1, 108c2 and 108c3 of the semiconductor chip 100 through the corresponding RDL trace 204c.

In some embodiments, the chip pads 106 and 108 (including the chip pads 106a1, 106a2, 106b1, 106b2, 106c1, 108a1, 108a2, 108b1, 108b2, 108c1, 108c2 and 108c3) are disposed on the front surface 102 of the semiconductor chip 100, and the RDL pads 210 (including the RDL pads 210a1, 210a2, 210b1 and 210b2, 210c1 and 210c2) are disposed on a front surface of the RDL structure 203 over the front surface 102 of the semiconductor chip 100.

In some embodiments as shown in FIG. 4, the semiconductor package 500b further comprises the bonding wires 300 (including bonding wires 300a1, 300a2, 300b1, 300b2, 300c1 and 300c2) connecting between the RDL pads 210 and the designated chip pads 110 (including chip pads 110a1, 110a2, 110b1, 110b2, 110c1 and 110c2) without covered by the RDL structures 200b. For example, the bonding wire 300a1 has two terminals being in contact with and electrically coupled to the RDL pad 210a1 and the designated chip pad 110a1 of the semiconductor chip 100, respectively. The bonding wire 300a2 has two terminals being in contact with and electrically coupled to the RDL pad 210a2 and the designated chip pad 110a2 of the semiconductor chip 100, respectively. The bonding wire 300b1 has two terminals being in contact with and electrically coupled to the RDL pad 210b1 and the designated chip pad 110b1 of the semiconductor chip 100, respectively. The bonding wire 300b2 has two terminals being in contact with and electrically coupled to the RDL pad 210b2 and the chip pad 110b2 of the semiconductor chip 100. The bonding wire 300c1 has two terminals being in contact with and electrically coupled to the RDL pad 210c1 and the designated chip pad 110c1 of the semiconductor chip 100, respectively. The bonding wire 300c2 has two terminals being in contact with and electrically coupled to the RDL pad 210c2 and the designated chip pad 110c2 of the semiconductor chip 100, respectively. In some embodiments, the bonding wires 300 provide another design choice for external electrical connections to replace portions of internal interconnections of the same functional circuits at different positions of the semiconductor chip 100. Therefore, the chip pads 106a1, 106a2, 108a1, 108a2 and 108a3 are electrically coupled to the designated chip pads 110a1 and 110a2, which are disposed so as not to overlap the RDL structure 200b, through the bonding wires 300a1 and 300a2. Similarly, the chip pads 106b1, 106b2, 108b1 and 108b2 are electrically coupled to the designated chip pads 110b1 and 110b2, which are disposed in such a manner that they do not overlap the RDL structure 200b, through the bonding wires 300b1 and 300b2. Similarly, the chip pads 106c1, 108c1, 108c2 and 108c3 are electrically coupled to the designated chip pads 110c1 and 110c2, which are disposed so as not to overlap the RDL structure 200b, through the bonding wires 300c1 and 300c2.

In some embodiments, the RDL structure 200b of the semiconductor package 500b further comprises the RDL pads 210 disposed on the RDL traces 204. In some embodiments, the RDL pads 210 may provide relocated input/output (I/O) electrical connections of the corresponding RDL traces 204. Also, the RDL pads 210 may be electrically coupled to the designated chip pads 110, which are disposed so as not to overlap the RDL structure 200b, through the bonding wires 300. Therefore, the semiconductor package 500b may further increase the design flexibility for the external electrical connections to replace portions of internal interconnections of the same functional circuits at different positions of the semiconductor chip 100. Therefore, the IR drop performance of the semiconductor chip may be further improved.

Figure 5:
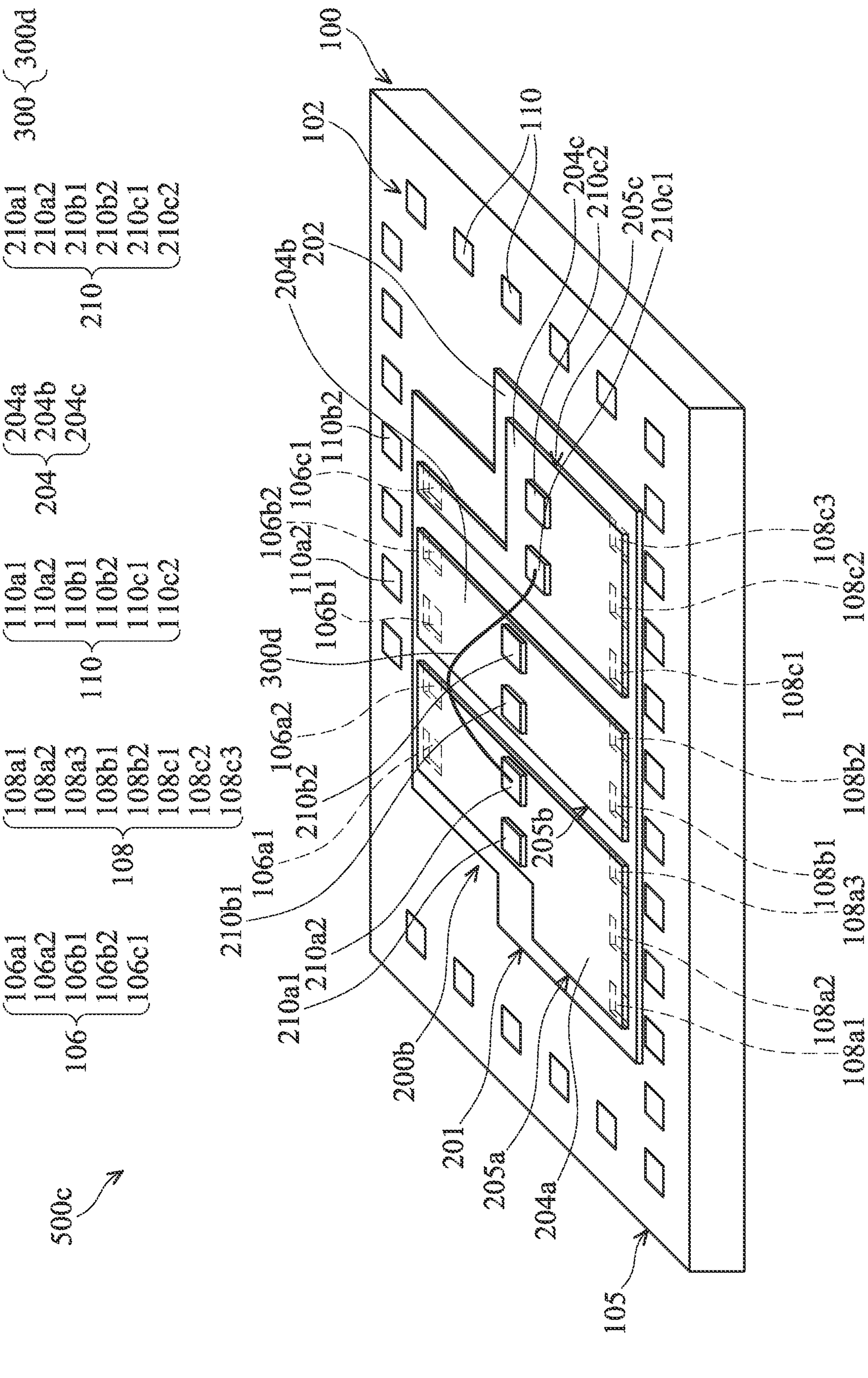
FIG. 5 is a top view of a region shown in FIG. 3, showing the arrangements of a semiconductor chip, a redistribution layer (RDL) structure and bonding wires of the semiconductor package shown in FIG. 3 in accordance with some embodiments of the disclosure.

FIG. 5 is a top view of the region 900*b* shown in FIG. 3, showing the arrangements of the semiconductor chip 100, the redistribution layer (RDL) structure 200*b* and a bonding wire 300*d* of the semiconductor package 500*c* shown in FIG. 3 in accordance with some embodiments of the disclosure. For clearly showing the conductive routings between the semiconductor chip 100 and the redistribution layer (RDL) structure 200*b*, the passivation layer covering RDL traces of the RDL structure 200*a*, the heat dissipation structure, the molding compound and the bonding wires connecting between the semiconductor chip 100 and the bonding pads of the substrate 700 are not shown in FIG. 5. Elements of the embodiments hereinafter, that are the same or similar as those previously described with reference to FIGS. 1 and 2, are not repeated for brevity.

The difference between the semiconductor package 500*a* and the semiconductor package 500*c* is that the semiconductor package 500*c* includes the redistribution layer (RDL) pads 210 on the RDL trace 204 and bonding wires 300 connecting between the different RDL pads 210. The RDL pads 210 and the bonding wires 300 connected thereto of the semiconductor packages 500*c* may provide the design flexibility for the external electrical connections for the semiconductor chip 100.

In some embodiments as shown in FIG. 5, the semiconductor package 500*c* further comprises a bonding wire 300*d* connecting between the RDL pads 210*a*2 and 210*c*1, which are respectively disposed on the discrete RDL traces 204*a* and 204*c*. For example, the bonding wire 300*d* has two terminals in contact with and electrically coupled to the RDL pad 210*a*2 and the RDL pad 210*c*1 of the semiconductor chip 100, respectively. Therefore, the chip pads 106*a*1, 106*a*2, 108*a*1, 108*a*2 and 108*a*3, which are electrically coupled to the RDL trace 204*a*, are electrically coupled to the chip pads 106*c*1, 108*c*1, 108*c*2 and 108*c*3, which are electrically coupled to the RDL trace 204*c*, respectively through the bonding wire 300*d*. Therefore, the semiconductor package 500*c* may further increase the design flexibility for the external electrical connections to replace portions of internal interconnections of the same functional circuits at different positions of the semiconductor chip 100. Therefore, the IR drop performance of the semiconductor chip may be further improved.

Embodiments provide the semiconductor packages 500*a*, 500*b* and 500*c*, such as a system-on-chip (SOC) package, disposed on the base 800. The semiconductor package includes the semiconductor chip 100 and the redistribution layer (RDL) structure 200*a* or 200*b*. The semiconductor chip 100 includes the chip pads 106, 108 and 110. The redistribution layer (RDL) structure 200*a* or 200*b* partially covers the semiconductor chip 100 and is separated from the base 800 through the semiconductor chip 100. The RDL structure 204 includes a redistribution layer (RDL) trace 204 having a first end and a second end. The first end of the RDL trace 204 is electrically coupled to the chip pads 106, and the second end of the RDL trace 204 is electrically coupled to the chip pads 108. In some embodiments, the chip pads 106 and 108 may serve as, power pads of the semiconductor chip. In some embodiments, the RDL structure 200*a* or 200*b* is disposed in such a way that it does not overlap the chip pads 110 of the semiconductor chip. In some embodiments, the sidewall 211 of the RDL structure 200*a* or 200*b* is disposed laterally between the chip pads 106 and 108 of the semiconductor chip 100 and the chip pads 110 of the semiconductor chip 100.

In some embodiments, the semiconductor package is designed to include the RDL structure to provide external conductive paths to replace portions of internal interconnections of the same functional circuits of the semiconductor chip, such that the RDL structure can be designed to partially cover rather than fully cover the semiconductor chip. In addition, the RDL traces of the RDL structure are designed to have grater width than the interconnections (not shown) of the same functional circuits of the semiconductor chip. Therefore, the RDL traces may provide conductive paths with a lower resistance. Some internal circuits having the same function (e.g. the power circuits) and at different positions of the semiconductor chip may be respectively rerouted and electrically connected to the chip pads (e.g., power pads) of the semiconductor chip. Further, the chip pads can be electrically coupled to each other through the external RDL traces of the RDL structure having the lower resistance. Therefore, the whole semiconductor chip may have improved IR drop performance. In addition, the RDL structure of the semiconductor package may facilitate rerouting the current paths in regions of high power density in the semiconductor chip, such that the current hot spots in the semiconductor chip could be effectively reduced. Further, the RDL structure of the semiconductor package may prevent other different power circuits from cutting off the RDL connections of the power/ground mesh inside the semiconductor chip (IC), such that the power integrity could be assured. In some embodiments, the RDL structure of the semiconductor package further comprises the RDL pads disposed on the RDL traces. The RDL pads may provide relocated input/output (I/O) electrical connections of the corresponding RDL traces. In addition, the RDL pads may be electrically coupled to the designated chip pads, which are disposed in such a way that they do not overlap the RDL structure, through the bonding wires. In some embodiments, the semiconductor package further comprises the bonding wire connecting between the RDL pads, which are respectively disposed on the discrete RDL traces. Therefore, the semiconductor package may further increase the design flexibility for the external electrical connections to replace portions of internal interconnections of the same functional circuits at different positions of the semiconductor chip. Therefore, the IR drop performance of the semiconductor chip may be further improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package on a base, comprising:

a semiconductor chip comprising a first chip pad and a second chip pad;

a redistribution layer (RDL) structure partially covering the semiconductor chip and separated from the base by the semiconductor chip, wherein the RDL structure comprises:

a redistribution layer (RDL) trace having a first end and a second end on the same RDL trace, wherein the first end of the RDL trace is electrically coupled to the first chip pad, and the second end of the RDL trace is electrically coupled to the second chip pad; and a first redistribution layer (RDL) pad, wherein the first RDL pad is disposed on a first side of the RDL trace, and both the first and the second chip pads of the semiconductor chip are disposed on a second side of the RDL trace that is opposite to the first side of the RDL trace, wherein an overlapping area between the RDL structure and the semiconductor chip is the same size as an area of the RDL structure in a top view;

a substrate between the base and the semiconductor chip, wherein the semiconductor chip is disposed on the substrate; and a first bonding wire electrically coupled to a third chip pad of the semiconductor chip and a bonding pad of the substrate, wherein the third chip pad is exposed from the RDL structure.

2. The semiconductor device as claimed in claim 1, wherein a boundary of the RDL structure is located within a boundary of the semiconductor chip in a top view.

3. The semiconductor device as claimed in claim 1, wherein the area of the RDL structure is greater than 50% but less than 100% of an area of the semiconductor chip in the top view.

4. The semiconductor device as claimed in claim 1, wherein the first redistribution layer (RDL) pad is electrically coupled to the RDL trace.

5. The semiconductor device as claimed in claim 4, wherein the first RDL pad is disposed between the first end and the second end of the RDL trace and within a boundary of the RDL trace.

6. The semiconductor device as claimed in claim 4, further comprising:

a second bonding wire electrically coupled to the first RDL pad and a fourth chip pad of the semiconductor chip, wherein the fourth chip pad is disposed outside a boundary of the RDL structure.

7. The semiconductor device as claimed in claim 4, further comprising:

a third bonding wire electrically coupled to the first RDL pad and a second RDL pad of the RDL structure.

8. A semiconductor package disposed on a base, comprising:

a semiconductor chip having a front surface and a back surface opposite to the front surface, wherein the back surface of the semiconductor chip is closer to the base than the front surface of the semiconductor chip;

a redistribution layer (RDL) structure disposed on the front surface of the semiconductor chip, overlapping and electrically coupled to a first chip pad and a second chip pad of the semiconductor chip, wherein the RDL structure is disposed without overlapping a third chip pad of the semiconductor chip, wherein the RDL structure comprises:

a redistribution layer (RDL) trace; and a first redistribution layer (RDL) pad, wherein the first RDL pad is disposed on a first side of the RDL trace, and both the first and the second chip pads of the semiconductor chip are disposed on a second side of the RDL trace that is opposite to the first side of the RDL trace, wherein an overlapping area between the RDL structure and the semiconductor chip is the same size as an area of the RDL structure in a top view;

a substrate between the base and the semiconductor chip, wherein the semiconductor chip is disposed on the substrate; and a first bonding wire electrically coupled to a fourth chip pad of the semiconductor chip and a bonding pad of the substrate, wherein the fourth chip pad is exposed from the RDL structure.

9. The semiconductor device as claimed in claim 8, wherein the redistribution layer (RDL) trace has a first end and a second end on the same RDL trace, wherein the first end of the RDL trace is electrically coupled to the first chip pad, and the second end of the RDL trace is electrically coupled to the second chip pad.

10. The semiconductor device as claimed in claim 9, wherein the first redistribution layer (RDL) pad is electrically coupled to the first chip pad and the second chip pad of the semiconductor chip through the RDL trace, and electrically coupled to the third chip pad of the semiconductor chip through a second bonding wire.

11. The semiconductor device as claimed in claim 10, wherein the first RDL pad is disposed on the RDL trace and within a boundary of the RDL trace.

12. The semiconductor device as claimed in claim 10, further comprising:

a third bonding wire electrically coupled to the first RDL pad and a second RDL pad of the RDL structure.

13. The semiconductor device as claimed in claim 10, further comprising:

a fourth bonding wire electrically coupled to the first RDL pad and the third chip pad of the semiconductor chip.

14. The semiconductor device as claimed in claim 8, wherein the third chip pad of the semiconductor chip is disposed between a sidewall of the RDL structure and a sidewall of the semiconductor chip.

15. A semiconductor package disposed on a base, comprising:

a semiconductor chip comprising a first chip pad, a second chip pad and a third chip pad;

a redistribution layer (RDL) structure overlapping a portion of the semiconductor chip and separated from the base by the semiconductor chip, wherein the RDL structure is electrically coupled to the first chip pad and the second chip pad of the semiconductor chip, wherein a sidewall of the RDL structure is disposed laterally between the first chip pad of the semiconductor chip and the third chip pad of the semiconductor chip, and wherein the RDL structure comprises:

a first redistribution layer (RDL) trace; and a first redistribution layer (RDL) pad, wherein the first RDL pad is disposed on a first side of the RDL trace, and both the first and the second chip pads of the semiconductor chip are disposed on a second side of the RDL trace that is opposite to the first side of the first RDL trace, wherein an overlapping area between the RDL structure and the semiconductor chip is the same size as an area of the RDL structure in a top view;

a substrate between the base and the semiconductor chip, wherein the semiconductor chip is disposed on the substrate; and a first bonding wire electrically coupled to a fourth chip pad of the semiconductor chip and a bonding pad of the substrate, wherein the fourth chip pad is exposed from the RDL structure.

16. The semiconductor device as claimed in claim 15, wherein the RDL structure overlaps the first chip pad and the second chip pad of the semiconductor chip, without overlapping the third pad of the semiconductor chip.

17. The semiconductor device as claimed in claim 15, wherein the first chip pad and the second chip pad of the semiconductor chip are respectively in contact with a first end and a second end of the same first redistribution layer (RDL) trace of the RDL structure.

18. The semiconductor device as claimed in claim 15, wherein the first redistribution layer (RDL) pad is electrically coupled to the first RDL trace.

19. The semiconductor device as claimed in claim 18, wherein the RDL structure further comprises:

a second redistribution layer (RDL) pad overlapping a second RDL trace separated from the first RDL trace, wherein the second RDL pad is electrically coupled to the first RDL pad through a second bonding wire.

20. The semiconductor device as claimed in claim 18, further comprising:

a third bonding wire electrically coupled to the first RDL pad and the third chip pad of the semiconductor chip.

* * * * *